United States Patent
Annambhotla et al.

(10) Patent No.: US 8,090,415 B2
(45) Date of Patent: Jan. 3, 2012

(54) INTELLIGENT BATTERY WARNING SYSTEM

(75) Inventors: Srinivas Annambhotla, Cary, NC (US); Vikram Makam Gupta, Cary, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 523 days.

(21) Appl. No.: 12/333,400

(22) Filed: Dec. 12, 2008

(65) Prior Publication Data

US 2010/0151918 A1  Jun. 17, 2010

(51) Int. Cl.
  *H04B 1/38* (2006.01)
(52) U.S. Cl. ......... 455/573; 455/571; 455/572; 370/318
(58) Field of Classification Search .......... 455/571–574, 455/552.1; 340/539.11; 370/318
  See application file for complete search history.

(56) References Cited

U.S. PATENT DOCUMENTS

| | | | |
|---|---|---|---|
| 5,497,507 A * | 3/1996 | Komaki | 455/552.1 |
| 5,565,759 A | 10/1996 | Dunstan | |
| 5,646,508 A | 7/1997 | van Phuoc et al. | |
| 5,682,273 A | 10/1997 | Hetzler | |
| 5,714,870 A | 2/1998 | Dunstan | |
| 5,982,147 A | 11/1999 | Anderson | |
| 6,114,836 A | 9/2000 | Hagiwara et al. | |
| 6,157,169 A | 12/2000 | Lee | |
| 6,189,106 B1 | 2/2001 | Anderson | |
| 6,735,456 B2 * | 5/2004 | Cathey et al. | 455/574 |
| 6,959,183 B2 | 10/2005 | Hutcheson et al. | |
| 2005/0076253 A1 | 4/2005 | Lu | |
| 2005/0255893 A1 * | 11/2005 | Jin et al. | 455/572 |
| 2007/0040449 A1 | 2/2007 | Spurlin et al. | |
| 2007/0052533 A1 * | 3/2007 | Glazer | 340/539.11 |
| 2007/0121536 A1 * | 5/2007 | Aihara | 370/318 |
| 2008/0133956 A1 | 6/2008 | Fadell | |

FOREIGN PATENT DOCUMENTS

| | | |
|---|---|---|
| JP | 2003 330579 | 11/2003 |
| WO | WO 2004/023279 A2 | 3/2004 |

OTHER PUBLICATIONS

International Search Report, corresponding to PCT/US2009/047153, mailed on Dec. 7, 2009.
Written Opinion, corresponding to PCT/US2009/047153, mailed on Dec. 7, 2009.
Luca Benini et al: "Discrete-Tie Battery Models for System-Level Low-Power Design" IEEE Transactions on Very Large Scale Integration (VLSI) Systems, IEEE Service Center, Piscataway, NJ, US, vol. 9, No. 5, Oct. 1, 2001, XP011063178 ISSN: 1063-8210 the whole document.

(Continued)

*Primary Examiner* — Jean Jeanglaude
(74) *Attorney, Agent, or Firm* — Renner, Otto, Boisselle & Sklar, LLP

(57) ABSTRACT

A method and system of providing a low battery charge warning in an electronic device that employs a rechargeable power source such as a rechargeable battery. The method and system determine whether a charge state of a battery is sufficient to provide the device with power for a predicted usage. The predicted usage and predicted power requirement may be determined from a usage profile of the device. The predicted usage and power requirement may also be determined from data associated with an event record as may be stored in a calendar application on the device. The method and system may provide an advance notice to the user of the device of a potential low battery situation.

17 Claims, 5 Drawing Sheets

OTHER PUBLICATIONS

Rakhmatov d N et al: "Battery modeling for energy-aware system design" Computer, IEEE Service Center, Los Alamitos, CA, US, vol. 36, No. 12, Dec. 1, 2003, pp. 77-87, XP011104024, ISSN: 0018-9162, the whole document.

Pop V et al "State-of-Charge Indication in Portable Applications" Industrial Electronics, 2005, ISIE 2005, Proceedings of the IEEE Inter National Symposium on Dubrovnik, Croatia Jun. 20-23, 2005, Piscataway, NJ, USA, IEEE, vol. 3, Jun. 20, 2005, pp. 1007-1012, XP010850222, ISBN: 978-0-7803-8738-6 he whole document.

Fundaro P A et al: "Battery management solutions for cost-sensitive applications" NORTHCON/98 Conference Proceedings Seattle, WA, USA Oct. 21-23, 1998, New York, NY, USA, IEEE, US, Oct. 21, 1998, pp. 169-173, XP010313483, ISBN: 978-0-7803-5075-5 the whole document.

International Preliminary Report on Patentability corresponding to International Application No. PCT/US2009/047153 mailed Jun. 23, 2011.

* cited by examiner

INTELLIGENT BATTERY WARNING SYSTEM

TECHNICAL FIELD OF THE INVENTION

The present invention relates to portable electronic devices including portable communication devices and methods of operating and using such devices.

DESCRIPTION OF THE RELATED ART

Portable electronic devices, including portable communication devices such as, for example, mobile telephones, are typically powered by a rechargeable battery. When the battery needs to be recharged, the device is connected to a charging source, e.g., an electrical outlet, cigarette lighter of a vehicle, or specialized source. Electronic devices typically include a means to notify the user that the battery's power is low and that the battery should be recharged. A low battery signal, whether visual or audible, may be given when the charge reaches a pre-defined, threshold charge level. For example, a low battery warning may be given when the remaining charge on the battery is about 5%. The means for notifying a user may be a visual indicator and/or an audible indicator. A visual indicator may be, for example, an image (sometimes in the shape of a battery) appearing on the display of the device. The image may be filled or unfilled to a particular degree to provide the user with an estimate of the charge remaining on the battery. An unfilled image may indicate that the battery has reached a pre-defined threshold charge level and needs to be recharged. Another visual indicator may be a pop-up display that appears when the battery's charge has depleted to a threshold charge level. Audible indictors may include, for example, an alarm such as a beep, vibration, or a series of such effects.

SUMMARY

The present invention provides a method and system of providing an advance notice of a low battery charge situation in an electronic device that employs a rechargeable power source such as a rechargeable battery. The method and system determine whether a charge state of a battery (at a particular time) is sufficient to provide the device with power for a predicted usage. The method and system are able to provide an advance low battery charge warning as compared to conventional battery warning systems. The battery warning system in accordance with the present invention is suitable for providing an advance notice or warning of a possible low battery situation. Unlike a conventional battery warning system, the advance battery warning system in accordance with the present invention is not bound to provide a warning based on a pre-defined, threshold battery charge state. Rather, the advance warning system provides an intelligent warning system operative to generate a low battery charge warning based on conditions associated with the device. The warning system will generate warnings specific to a particular device in relation to the charge state of the device and the predicted behavior of the device.

According to one aspect of the invention, a portable electronic device comprising: a rechargeable power source; and a battery warning system that executes logic to generate a low battery charge warning, the logic including code to: obtain data related to a charge state of the rechargeable power source at a time $t_n$; determine a predicted usage of the device for a period of time relative to time $t_n$; determine a predicted power requirement to power the device during the predicted usage; determine if the charge state of the power source is sufficient to supply the power, down to a threshold level, for the predicted power requirement; and generate a notice if the charge state is not sufficient for the predicted power requirement.

In one embodiment, the electronic devices comprises a calendar application that stores a record of a future event, the event record having data associated therewith indicating a future usage of the electronic device, wherein the logic executed by the battery warning system includes code to determine a power requirement of the device associated with the event record, and correlate the power requirement associated with the event record with the power requirement determined from the predicted usage of the device relative to time $t_n$.

In one embodiment, the predicted usage is determined from a usage profile of the device.

In one embodiment, the usage profile application determines a usage profile of the device for a 24-hour period.

In one embodiment, the usage profile application determines a usage profile of the device for a two-day period.

In one embodiment, the usage profile application determines a usage profile of the device for a seven-day period.

In one embodiment, the threshold level is a charge state of about 0%.

In one embodiment, the threshold level is a charge state greater than about 0%.

In one embodiment, the threshold level is configurable by a user.

In one embodiment, the device comprises a calendar application that stores a record of a future event, the event record having data associated therewith indicating a location of the device during the event, wherein the logic executed by the battery warning system includes code to determine a predicted power requirement of the device based on the predicted usage of the device from time $t_n$ through the time associated with the event record and determine if the charge state of the battery is sufficient to provide the power required for the electronic device through the event.

In one embodiment, the location data associated with an event includes data indicating if the device will have access to a charging source.

In one embodiment, the device comprises a position location application configured to determine a geographic location of the electronic device.

In one embodiment, the position location application associates data with the geographic location of the device indicating the availability of a charging source for the electronic device.

In one embodiment, the logic of the battery warning system includes code to correlate the predicted power requirement determined from the usage profile with data associated with the determined geographic location.

In one embodiment, the notice comprises a charging agenda for the user.

In one embodiment, the portable electronic device is a mobile phone.

According to another aspect the invention provides a method of generating an advance notice of a low battery charge for an electronic device having a rechargeable battery, the method comprising: determining a charge state of the battery at a time $t_n$; determining a predicted usage of the device for a period of time relative to time $t_n$; determining a predicted power requirement for the predicted usage; determining if the charge state of the battery at time $t_n$ is sufficient to supply the power, down to a threshold level, for the predicted power requirement associated with the predicted usage; and issuing a command to generate a notice if the charge state is not sufficient for the predicted power requirement.

In one embodiment, the method comprises obtaining data associated with an event record stored in a calendar application on the device, the data indicting whether the event is associated with a usage of the device, and wherein determining the predicted usage of the device comprises correlating the predicted power requirement for the predicted usage with the future usage associated with the event record.

In one embodiment, the method comprises determining the predicted usage of the device from a usage profile.

In one embodiment, the usage profile comprises the usage profile of the device for a 24-hour period.

In one embodiment, the usage profile comprises the usage profile of the device for a two-day period.

In one embodiment, the usage profile comprises the usage profile of the device for a seven-day period.

In one embodiment, the notice comprises a charging agenda for the user.

In one embodiment, the method comprises obtaining data associated with an event record stored in a calendar application on the device, the data associated with the event record including data indicating a location of the device during the event, the location data indicating whether the device will be accessible to a charging source for recharging the battery, (ii) determining a predicted power requirement from time $t_n$ through the time associated with event record, and (iii) determining if the remaining charge is sufficient to satisfy the predicted power requirement through the event.

These and other features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto.

Features that are described or illustrated with respect to one embodiment may be used in the same way or in a similar way in one or more other embodiments and/or in combination with or instead of the features of the other embodiments.

It should be emphasized that the term "comprises/comprising" when used in the specification is taken to specify the presence of stated features, integers, steps, or components, but does not preclude the presence or addition of one or more features, integers, steps, components, or groups thereof.

BRIEF DESCRIPTION OF THE DRAWINGS

Aspects of the invention may be better understood with reference to the following drawings. The components of the drawings are not necessarily to scale, emphasis instead being placed upon clearly illustrating the principles of the present invention. Likewise, elements and features in one drawing may be combined with elements and features depicted in other drawings. Moreover, like reference numerals designate corresponding parts throughout the several views.

While the diagrams or flow charts may show a specific order of executing functional logic blocks, the order of execution of the blocks may be changed relative to the order shown. Also, two or more blocks shown in succession may be executed concurrently or with partial concurrence. Certain blocks also may be omitted. In addition, any number of commands, state variables, semaphores or messages may be added to the logical flow for purposes of enhanced utility, accounting, performance, measurement, troubleshooting, and the like. It is understood that all such variations are within the scope of the present invention.

DETAILED DESCRIPTION OF EMBODIMENTS

The terms "electronic equipment" and "electronic device" include portable radio communication equipment. The term "portable radio communication equipment," which hereinafter is referred to as a "mobile radio terminal," includes all equipment such as mobile telephones, pagers, communicators, i.e., electronic organizers, personal digital assistants (PDAs), smartphones, portable communication apparatus, gaming devices or the like. The term "portable communication device" includes any portable electronic equipment including, for example, mobile radio terminals, mobile telephones, mobile devices, mobile terminals, communicators, pagers, electronic organizers, personal digital assistants, smartphones and the like. The term "portable communication device" also may include portable digital music players and/or video display devices, e.g., iPod devices, MP3 players, DVD players, gaming devices such as, for example, PSP, Nintendo, DS, etc.

In the present application, aspects of the invention are described primarily in the context of a mobile telephone. However, it will be appreciated that the invention is not intended to be limited to a mobile telephone and can be any type of portable electronic equipment that is powered by a rechargeable battery.

Figure 1:
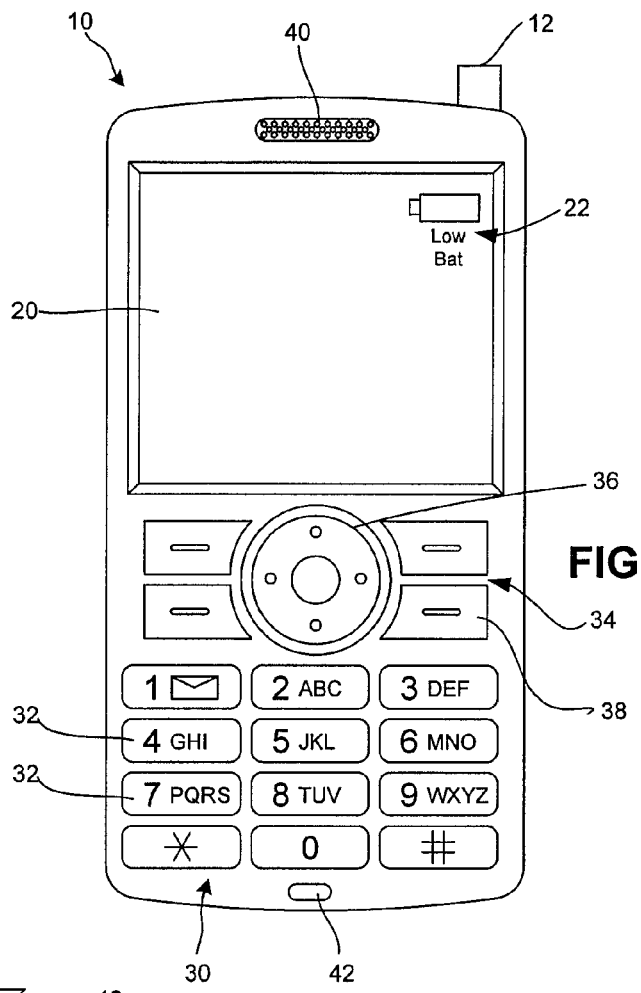
FIG. 1 is a schematic illustration of a portable electronic device embodied as a mobile telephone.

Referring to FIG. 1, an electronic device 10 suitable for use with the disclosed methods and applications is shown. The electronic device 10 in the exemplary embodiment is shown as a portable network communication device, e.g., a mobile telephone, and will be referred to as the mobile telephone 10. The mobile telephone 10 is shown as having a "brick" or "block" design type housing, but it will be appreciated that other type housings, such as clamshell housing or a slide-type housing, may be utilized without departing from the scope of the invention.

As illustrated in FIG. 1, the mobile telephone 10 may include a user interface that enables the user to easily and efficiently perform one or more communication tasks (e.g., enter in text, display text or images, send an E-mail, display an E-mail, receive an E-mail, identify a contact, select a contact, make a telephone call, receive a telephone call, etc.). The mobile phone 10 includes a case (housing), display 20, a keypad 30, speaker 40, microphone 42, and a number of keys 34. The display 20 may be any suitable display, including, e.g., a liquid crystal display, a light emitting diode display, or other display. The keypad 30 comprising a plurality of keys 32 (sometimes referred to as dialing keys, input keys, etc.). The keys in keypad area 30 may be operated, e.g., manually or otherwise to provide inputs to circuitry of the mobile phone 10, for example, to dial a telephone number, to enter textual input such as to create a text message, to create an email, or to enter other text, e.g., a code, pin number, security ID, to perform some function with the device, or to carry out some other function.

The keys 34 may include a number of keys having different respective functions. For example, the key 36 may be a navigation key, selection key, or some other type of key, and the keys 38 may be, for example, soft keys or soft switches. As an example, the navigation key 36 may be used to scroll through lists shown on the display 20, to select one or more items shown in a list on the display 20, etc. The soft switches 38 may be manually operated to carry out respective functions, such as those shown or listed on the display 20 in proximity to the respective soft switch. The speaker 40, microphone 42, display 20, navigation key 36 and soft keys 38 may be used and function in the usual ways in which a mobile phone typically is used, e.g. to initiate, to receive and/or to answer telephone calls, to send and to receive text messages, to connect with and carry out various functions via a network, such as the Internet or some other network, to beam information between mobile phones, etc. These are only examples of suitable uses or functions of the various components, and it will be appreciated that there may be other uses, too.

The mobile telephone 10 includes a display 20. The display 20 displays information to a user such as operating state, time, telephone numbers, contact information, various navigational menus, status of one or more functions, etc., which enable the user to utilize the various features of the mobile telephone 10. The display 20 may also be used to visually display content accessible by the mobile telephone 10. The displayed content may include E-mail messages, geographical information, journal information, audio and/or video presentations stored locally in memory 60 (FIG. 2) of the mobile telephone 10 and/or stored remotely from the mobile telephone (e.g., on a remote storage device, a mail server, remote personal computer, etc.), information related to audio content being played through the device (e.g., song title, artist name, album title, etc.), and the like. Such presentations may be derived, for example, from multimedia files received through E-mail messages, including audio and/or video files, from stored audio-based files or from a received mobile radio and/or television signal, etc. The displayed content may also be text entered into the device by the user. The audio component may be broadcast to the user with a speaker 40 of the mobile telephone 10. Alternatively, the audio component may be broadcast to the user though a headset speaker (not shown).

The device 10 optionally includes the capability of a touchpad or touch screen. The touchpad may form all or part of the display 20, and may be coupled to the control circuit 50 for operation as is conventional.

Various keys other than those keys illustrated in FIG. 1 may be associated with the mobile telephone 10 may include a volume key, audio mute key, an on/off power key, a web browser launch key, an E-mail application launch key, a camera key, etc. Keys or key-like functionality may also be embodied as a touch screen associated with the display 20.

The mobile telephone 10 includes conventional call circuitry that enables the mobile telephone 20 to establish a call, transmit and/or receive E-mail messages, and/or exchange signals with a called/calling device, typically another mobile telephone or landline telephone. However, the called/calling device need not be another telephone, but may be some other device such as an Internet web server, E-mail server, content providing server, etc.

Figure 2:
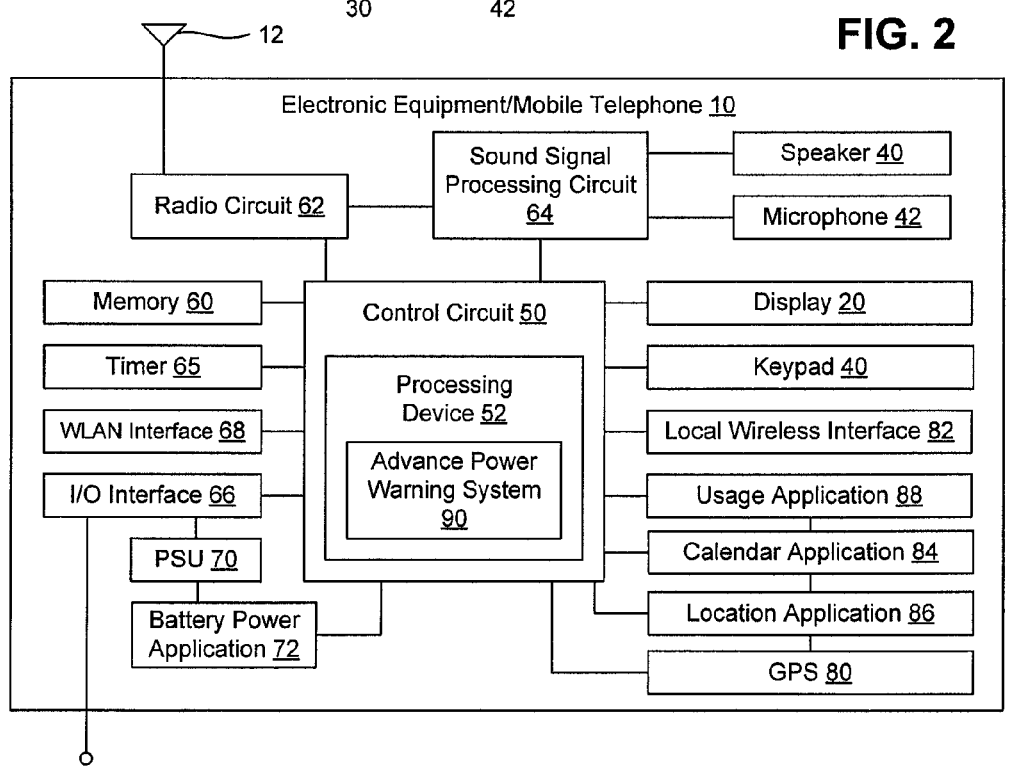
FIG. 2 is a diagrammatic illustration of components of the mobile telephone of FIG. 1.

Referring to FIG. 2, a functional block diagram of the mobile telephone 10 is illustrated. The mobile telephone 10 includes a primary control circuit 50 that is configured to carry out overall control of the functions and operations of the mobile telephone 10. The control circuit 50 may include a processing device 52, such as a CPU, microcontroller or microprocessor. The processing device 52 executes code stored in a memory (not shown) within the control circuit 50 and/or in a separate memory, such as memory 60, in order to carry out operation of the mobile telephone 10.

The memory 60 may be, for example, a buffer, a flash memory, a hard drive, a removable media, a volatile memory and/or a non-volatile memory.

Continuing to refer to FIGS. 1 and 2, the mobile telephone 10 includes an antenna 12 coupled to a radio circuit 62. The radio circuit 62 includes a radio frequency transmitter and receiver for transmitting and receiving signals via the antenna 12 as is conventional. The mobile telephone 10 generally utilizes the radio circuit 62 and antenna 12 for voice and/or E-mail communications over a cellular telephone network. The mobile telephone 10 further includes a sound signal processing circuit 64 for processing the audio signal transmitted by/received from the radio circuit 62. Coupled to the sound processing circuit 64 are the speaker 40 and the microphone 42 that enable a user to listen and speak via the mobile telephone 10 as is conventional. The radio circuit 62 and sound processing circuit 64 are each coupled to the control circuit 50 so as to carry out overall operation.

The mobile telephone 10 also includes the aforementioned display 20 and keypad 30 coupled to the control circuit 50. The device 10 and display 20 optionally includes the capability of a touchpad or touch screen, which may be all of part of the display 30. The mobile telephone 10 further includes an I/O interface 66. The I/O interface 66 may be in the form of typical mobile telephone I/O interfaces, such as a multi-element connector at the base of the mobile telephone 10. As is typical, the I/O interface 66 may be used to couple the mobile telephone 10 to a battery charger to charge a power supply unit (PSU) 70 within the mobile telephone 10. In addition, or in the alternative, the I/O interface 66 may serve to connect the mobile telephone 10 to a wired personal hands-free adaptor, to a personal computer or other device via a data cable, etc. The mobile telephone 10 may also include a timer 65 for carrying out timing functions. Such functions may include timing the durations of calls and/or events, tracking elapsed times of calls and/or events, generating timestamp information, e.g., date and time stamps, etc.

The mobile telephone 10 may include various built-in accessories. For example, the device 10 may include a camera for taking digital pictures. Image files corresponding to the pictures may be stored in the memory 60. In one embodiment, the mobile telephone 10 also may include a position data receiver, such as a global positioning satellite (GPS) receiver 80, Galileo satellite system receiver, or the like. The mobile telephone 10 may also include an environment sensor to measure conditions (e.g., temperature, barometric pressure, humidity, etc.) in which the mobile telephone is exposed.

The mobile telephone 10 may include a local wireless interface adapter 82, such as a Bluetooth adaptor to establish wireless communication with other locally positioned devices, such as the a wireless headset, another mobile telephone, a computer, etc. In addition, the mobile telephone 10 may also include a wireless local area network interface adapter 68 to establish wireless communication with other locally positioned devices, such as a wireless local area network, wireless access point, and the like. Preferably, the WLAN adapter 68 is compatible with one or more IEEE 802.11 protocols (e.g., 802.11(a), 802.11(b) and/or 802.11(g), etc.) and allows the mobile telephone 20 to acquire a unique address (e.g., IP address) on the WLAN and communicate with one or more devices on the WLAN, assuming the user has the appropriate privileges and/or has been properly authenticated.

As shown in FIG. 2, the processing device 52 is coupled to memory 60. Memory 60 stores a variety of data that is used by the processor 52 to control various applications and functions of the device 10. It will be appreciated that data can be stored in other additional memory banks (not illustrated) and that the memory banks can be of any suitable types, such as read-only memory, read-write memory, etc. The memory 60 may store, for example, usage data including usage profiles representing an average usage activity of the device over selected periods of time.

The device 10 may include a calendar application 84. The calendar application 84 may be used to create a record of upcoming events that the user wishes to store on the device to remind the user that the event is forthcoming. A calendar event record may have various data associated therewith. For example, the record may include data (or metadata) related to the subject, date, time, location, type of event or activity (e.g., whether the event is a meeting, conference call, etc.). Upon creating the event record, the calendar application and/or other applications may be configured to create additional data associated with the event record. For example, the calendar application may take data associated with the event record that identifies the event as a particular activity, e.g., a meeting or conference call and create data that further indicates that the event will be associated with or require usage of the electronic device 10 for the period of time that the event is scheduled.

The device may also include a location application 86. The location application may be configured to determine the location of the electronic device. The location application may be coupled with the GPS system 80 to determine the location of the electronic device. The location application 86 may be programmed to associate a particular location, as determined by GPS coordinates, with a specific location relevant or specific to the user. For example, the location application may be programmed to associate a particular geographic location as the user's home, the user's work, or any other specific location desired by the user.

The device further includes an advance power warning system 90, which may also be referred to as advance battery warning system (and the two terms are used interchangeably herein). The advance battery warning system 90 is configured for determining a probable low battery situation and generating a notice to the user of a possible low battery situation. The advance warning system (i) determines a charge state of the battery at a selected time, (ii) determines a predicted power requirement for the device relative to the time at which the battery's charge state is determined, and (iii) determines if the charge state of the battery is sufficient to satisfy the predicted power requirement. The advance battery warning system 90 includes logic to execute code to determine if the electronic device may be in a low charge state based on various data parameters associated with the electronic device including, but not limited to, a predicted usage of the device and the charge state of the battery. The advance warning system may also determine if the device is in a low charge state based on other factors or data including, for example, future usage events as determined from an event record in the device's calendar application, the location of the device, a future location of the device based on an event record in the device's calendar application, and the like.

The charge state of the battery at a given time may be determined, for example, by a battery power application 72 coupled with the power source unit (e.g., battery) 70. The battery power application 72 is configured for determining the charge state of the battery 70. For example, the battery power application 72 may extract data related to the charge remaining on the battery, which may be converted to or expressed as a percentage of the charge remaining.

Figure 3:
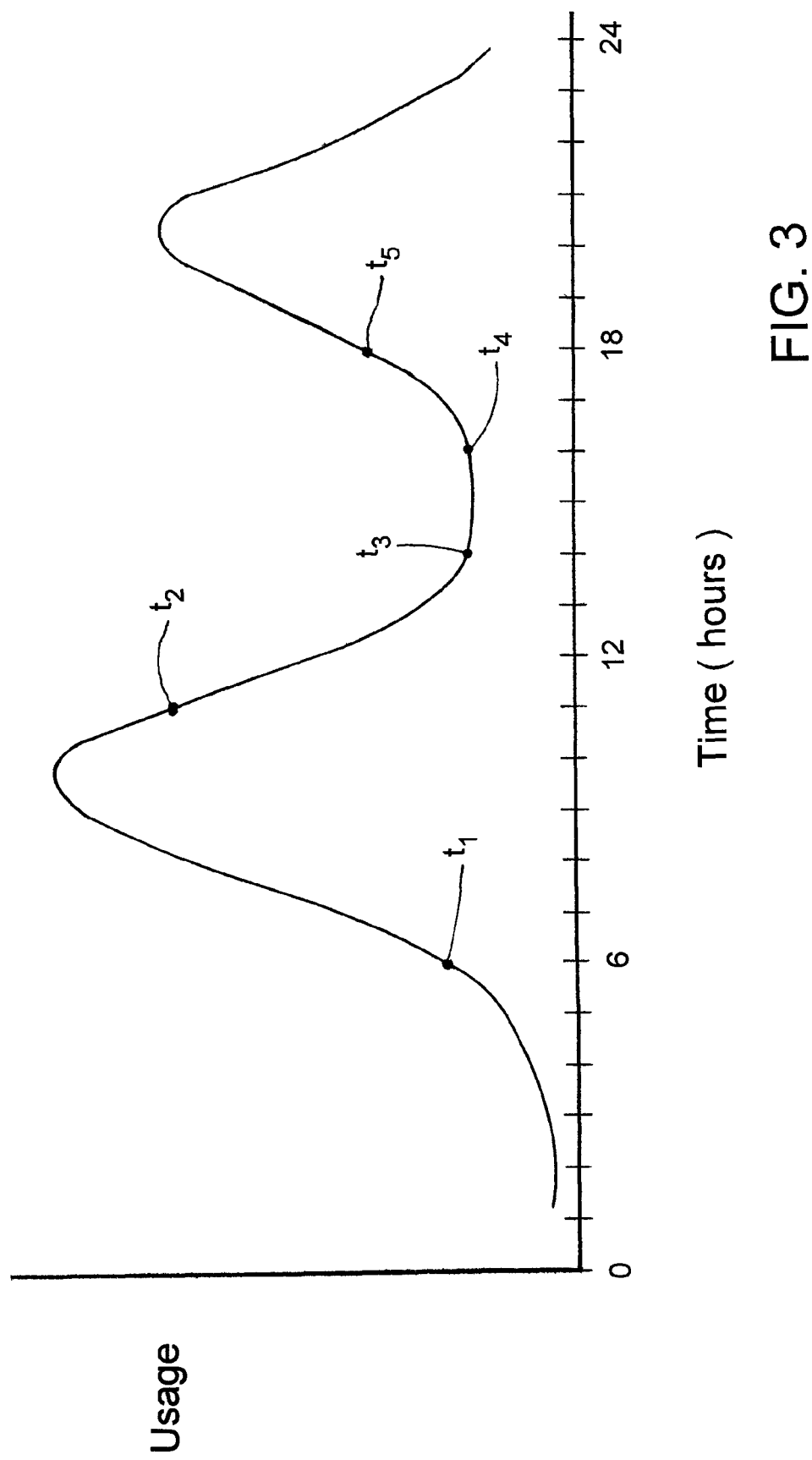
FIG. 3 is a usage profile of an electronic device illustrated as a usage distribution curve.

The predicted power requirement of the device may be determined based on a predicted usage of the device (relative to the time the charge state of the battery is determined). The predicted usage of the device may be determined from a usage profile of the device. The usage profile may be determined from a usage profile application 88. The usage profile application 88 is configured to obtain data related to the usage activity of the device and determine a usage profile for the device over a selected period of time. The usage data may include the amount of time the device is used for various activities including telephone calls, text messaging, e-mails, document review, internet usage, and the like, the length of such activities, and the time at which such activities take place within a selected time frame. The usage profile application 88 uses the device usage data to generate a usage profile. Referring to FIG. 3, a usage profile may be represented as a usage distribution curve providing a representation of the average usage of a particular electronic device over a selected period of time. In FIG. 3, the usage profile is shown as the usage profile for the device over a 24-hour period. As illustrated in FIG. 3, the usage distribution curve shows that the usage of the device increases during certain times of the day and also decreases or remains constant during certain periods. For example, the distribution profile in FIG. 3 indicates that the usage of the device increases in the morning (e.g., between hours 6 and 9), is constant or decreases during the afternoon (e.g., between hours 12 and 17) and then increases again later during the day (e.g., between hours 17 and 21).

It will be appreciated that the usage profile shown in FIG. 3 is only an illustration of what a usage distribution profile may look like for an electronic device. The usage profile of a device may change over time as the usage behavior of the device changes. Additionally, different electronic devices will have different usage profiles that reflect the different usage behaviors of the respective users. The usage profile application may determine a usage profile over any selected time period as desired for a particular use or intended purpose. Further, the usage profile application may be configured to determine multiple usage profiles for a device. For example, the usage profile application may determine usage profiles for different time periods such as a one-day profile (e.g., 24 hour time period), a two-day profile, a three-day profile, etc., a weekly profile, a monthly profile, etc. A separate usage profile may also be determined for a particular day. For example, individual, one-day profiles may be determined for each day of the week. Additionally, specific multiple-day profiles may be determined such as, for example, a usage profile for the weekend (e.g., Saturday and Sunday or Friday, Saturday, and Sunday).

Figure 4:
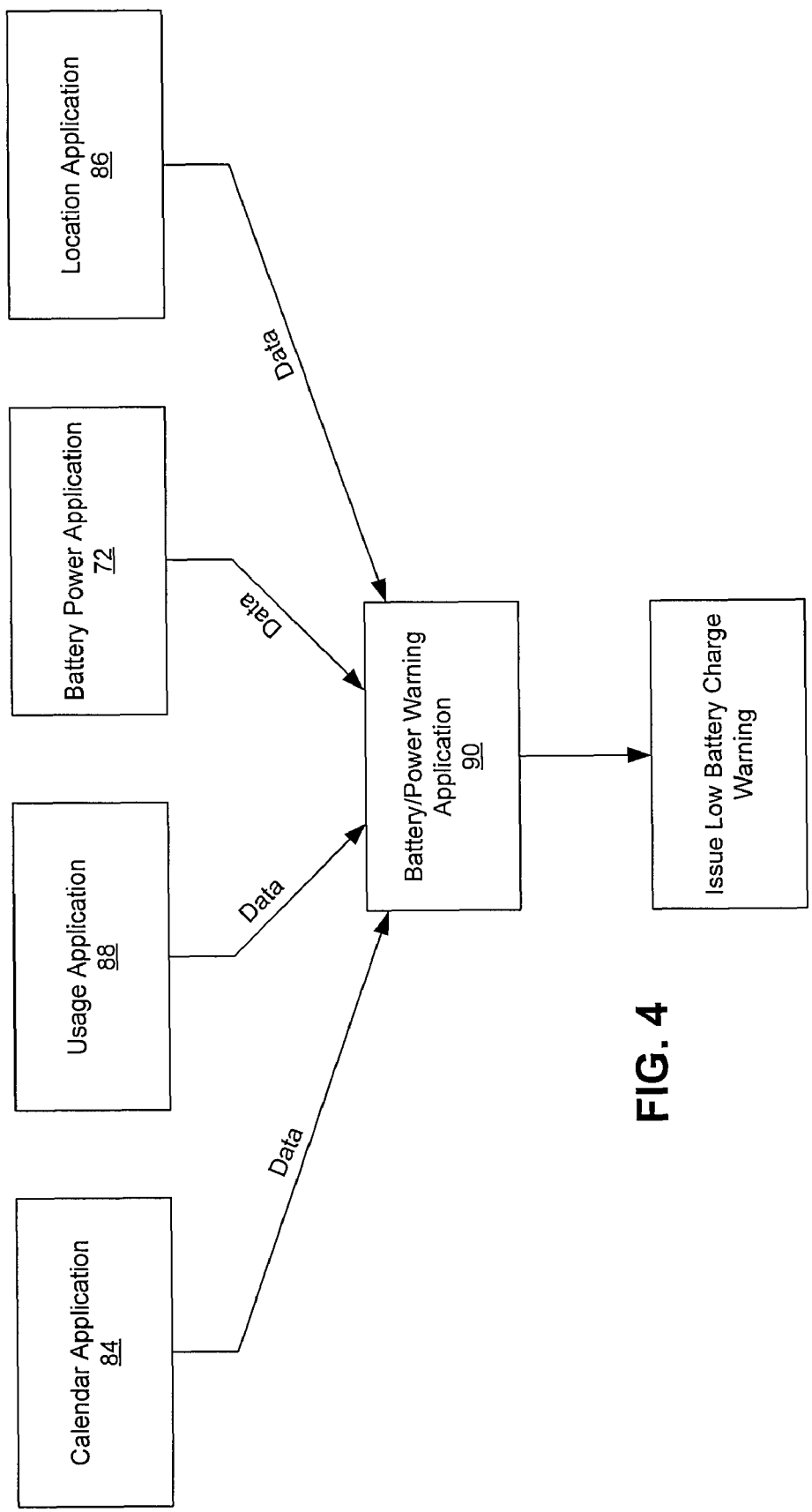
FIG. 4 is a schematic representation of an exemplary flow of data for a battery warning system in accordance with aspects of the present invention.

Referring to FIG. 4, a schematic flow of information from a relevant application to the battery warning system 90 is illustrated. The battery warning system 90 may obtain data as input from various applications such as the usage profile application 88, the battery power application 72, the calendar application 84, and the location application 86. The data may be obtained by the battery warning system by extracting the data from the particular application, or the data may be automatically pushed to the battery warning system 90 by the respective applications. Generally, the battery warning system 90 is configured to correlate the data to determine whether the device has sufficient power based on a predicted power requirement determined from a predicted usage of the device and, subsequently whether a low battery warning should be issued.

Figure 5:
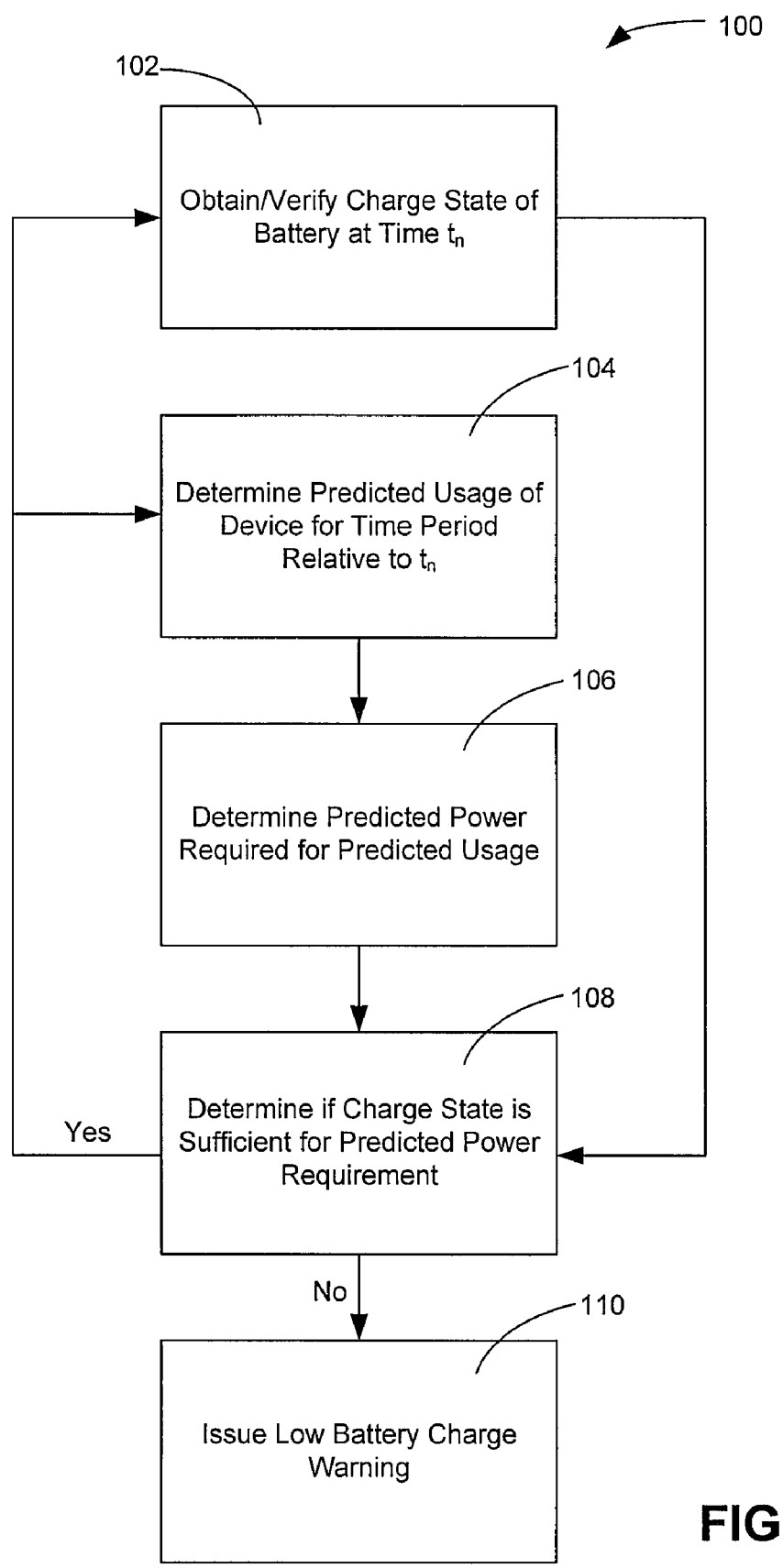
FIG. 5 is a flow chart illustrating an exemplary method for generating a low battery charge warning in accordance with aspects of the present invention.

In one embodiment, the battery warning system 90 determines whether a notice of a potential low battery situation should be issued based on at least (i) a usage profile of the device, and (ii) the charge state of the battery. FIG. 5 illustrates a process 100 for determining if a low battery charge warning should be generated. At functional box 102, the battery warning system 90 obtains the charge status of the battery at a time $t_n$ from the battery power application 72, and at functional block 104, the battery warning system 90 obtains a usage profile of the device (from the usage profile application 88). At functional box 106, the battery warning system determines a predicted power requirement of the device relative to time $t_n$. At functional block 108, the battery warning system 90 determines if the remaining charge of the battery is sufficient to provide power to the device in view of the predicted usage based on the usage profile distribution. If the charge is sufficient for the predicted usage, the logic flows back to functional boxes 102 and 104 and the process is repeated at a time subsequent to time $t_n$. If the charge is not sufficient for the predicted usage, the flow proceeds to functional box 110, and the battery warning system 90 issues a command to generate a warning or notice that the battery should be charged.

The predicted power requirement of the device relative to time $t_n$ may be determined from a predicted usage of the device relative to time $t_n$, which may be determined, for example, from a usage profile of the device. In general, the consumption of the battery's charge is proportional to the usage of the device. From the usage profile, the battery warning system 90 may determine or estimate a predicted usage of the device relative to the time ($t_n$) the battery's charge was determined and then determine a predicted power requirement based on the predicted usage. The battery warning system includes applications and logic configured to convert the predicted usage data to a predicted power requirement for that predicted usage.

The time period selected for the determined predicted usage (and the predicted power requirement for such usage) is not particularly limited. The battery warning system may be programmed to look at particular blocks or time relative to time $t_n$ (e.g., three hours, four hours, five hours, six hours, etc.) to determine a predicted usage and, subsequently, a predicted power requirement for that usage.

Figure 6:
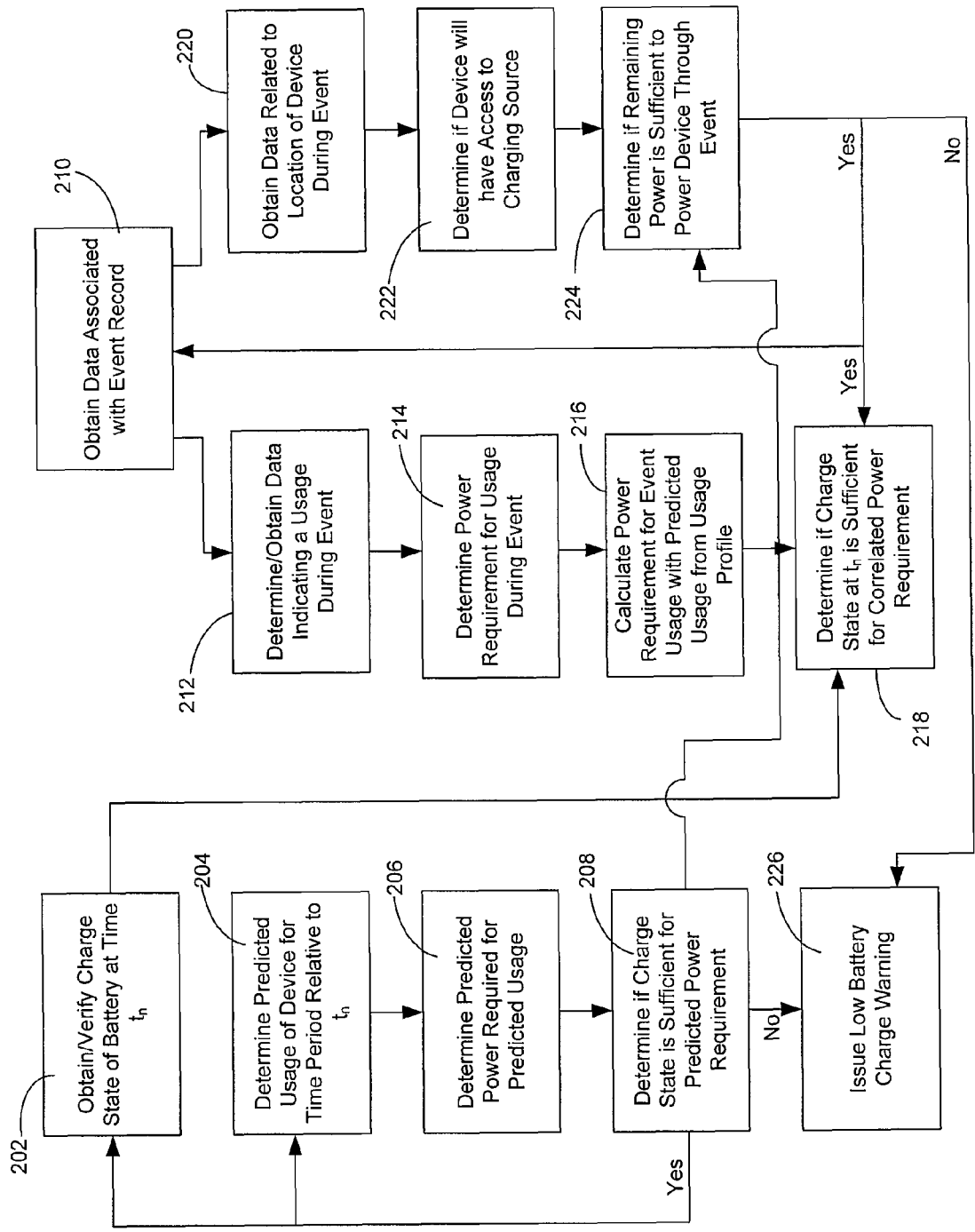
FIG. 6 is a flow chart illustrating another exemplary method for generating a low battery charge warning in accordance with aspects of the present invention.

In another embodiment, the battery warning system 90 may evaluate additional data to determine if a charge battery warning should be generated. Referring to FIG. 6, a method 200 is shown for determining if a charge battery warning should be generated by the battery warning system 90. Similar to the logic flow in FIG. 5, the battery warning system obtains charge data from the battery power application 72 (functional block 202) and a usage profile of the device from usage profile application 88 (functional block 204). At functional block 204, the battery warning system may also determine, from the usage profile, a predicted usage of the device relative to time $t_n$. Similar to the flow chart of FIG. 5, at functional block 206, the battery warning system determines a predicted power requirement for the determined, predicted usage of the device. As in FIG. 5, the process may flow to functional box 208, where the battery warning system determines if the charge remaining at time $t_n$ is sufficient to provide the predicted power requirement for the predicted usage of the device. If it is, the process may flow back to functional boxes 202 and 204 and repeat the process at a time $t_{n+x}$ (i.e., a time subsequent to time $t_n$). If the battery warning system determines that the power is not sufficient, the process may flow to functional block 224, and the battery warning system issues a low battery charge warning.

In the process shown in FIG. 6, at functional block 210, the battery warning system may also obtain data associated with an event record, such as an event record stored in the calendar application 84. The process may proceed to functional block 212 and/or functional block 220, which relate to the processing of different data associated with the event record. At functional block 212, the battery warning system obtains and evaluates data related to a predicted usage of the device associated with the event record. For example, metadata associated with the event record may indicate that the event is a meeting or telephone conference and such data can be recognized as a usage event for the device during the scheduled event time. At functional block 214, the battery warning system determines the power required for the usage of the device during the event associated with the event record. Moving to functional block 216, the battery warning system determines a predicted power requirement by correlating the determined power requirement for the usage associated with the event record (from functional block 214) and the power requirement determined from the predicted usage based on the usage profile (from functional block 206). At functional block 218, the battery warning system then determines if the battery charge remaining at time $t_n$ is sufficient for the power requirement determined in functional block 216. If it is, the process may flow to back to functional block 206 and repeat the process based on the charge at a time $t_{n+x}$ (i.e., at a time subsequent to time $t_n$). If the remaining power is not sufficient, the process flows to functional block 226, and a low battery charge warning is generated.

In another aspect, the process may flow from functional block 210 to functional block 220, wherein the data obtained by the battery warning system that is associated with an event record indicates data related to a location of the device during the scheduled event. For example, the location data associated with the event may indicate that the event is scheduled for an office, the user's home, another person's home, a vehicle, an outdoor venue (e.g., a park), an entertainment venue (e.g., a stadium, arena, concert hall, etc.), and the like. The process then proceeds to functional box 222, where the battery warning system determines if the device will have access to a charging source for recharging the battery. The battery warning system may be programmed to recognize a particular location or venue as suitable for providing or having access to a charging source for recharging the electronic device. For example, the battery warning system may recognize or determine that locations such as an office, home, or vehicle (e.g., a car) will provide access to a charging source while locations such as an outdoor or entertainment venue do not provide such access. If the system determines that the location will not provide access to a power source, the process may flow to functional block 224, and the system may determine if the remaining power is sufficient to power the device through the event. If not, the system may generate a low battery charge warning at functional block 226. If the system determines that either (i) the location associated with the event record provides access to a power source (functional block 222), or (ii) the remaining power is sufficient to power the device through the event (functional block 224), the process may flow back to functional block 206.

It will be appreciated that, in one aspect, the functions illustrated in the set of functional blocks 212-218 and the set of functional blocks 220-224 may be performed separately and without performing the other set of functions. In another aspect, the system may perform both sets of functions. As further illustrated in FIG. 6, if the system obtains both future usage and location data associated with an event record (or separate event records), and the system determines that either (i) the location associated with the event record provides access to a power source (functional block 222), or (ii) the remaining power is sufficient to power the device through the event (functional block 224), the process may flow to functional block 218.

In another embodiment, the battery warning system may further evaluate the current geographic location of the device and use such data to determine if a low battery charge warning should be issued. For example a position or location of the electronic device may be determined using a GPS system on the device. The GPS system may determine the location of the device. The location application may use the GPS data to associate the device with a particular location, e.g., at home, at work, at a store, etc. The battery warning system may be programmed to indicate the device is near a charging source when the device is in a particular location, e.g., at home or at work. Using the usage profile, battery charge data, and current position information, the battery warning system may determine if the battery should be charged while the device is at it's current location. If so, a charge battery notice or warning may be provided.

The battery warning system determines if the determined charge state of the battery at a particular time is sufficient to provide power, down to a threshold power level, for a predicted requirement. The threshold power level is not particularly limited and may be selected as desired for a particular purpose or intended use. In one aspect, the threshold level may be a charge state of 0% (i.e., complete charge drain), 5%, 10%, or the like. Thus, in one aspect the battery warning system may determine if the predicted power requirement will drain the battery from its current charge state to a particular threshold level such as, for example, 0%, 5%, 10%, etc. The threshold level may be pre-programmed in the device or may be selectable (and changeable) by the user.

The battery warning system and method have been described as receiving data from various sources or applications such as a usage profile application and the battery charge application. It will be appreciated that such applications need not be separate from the battery warning system. Rather, such applications may be incorporated into the battery warning system, or the battery warning system may be programmed in a manner such that the battery warning system provides the functions associated with those applications.

Upon determining that the charge state may not be sufficient for a predicted usage, the battery warning system may issue a command to generate a notice to the user of a potential low battery situation, and the process control circuit may process the command and generate a notice using an appropriate application. As previously described (with respect to FIGS. 4-6, for example), a notice of a potential low battery situation may be in the form of a low battery warning. A low battery warning may be provided as a visual display and/or an audible display. For example, a warning may appear on the display 20 as a graphic or warning message that reads, for example, "Low Battery Charge Situation Detected". The displayed warning message is not limited, and could be more specific based on the particular situation such as, for example, "You will run out of battery power at around 10 AM;" "You will run out of battery power during the teleconference meeting today;" "Device should be charged for upcoming heavy usage period between 6 AM to 9 AM;" "You are located near a charging source now and charging up may be useful;" and the like. As shown in FIG. 1, the warning may be provided as a graphic 22 displayed by the display 20. The graphic 22 is shown as a non-filled, battery shaped image with the accompany text "low bat". In one aspect, such an image may appear only when the battery warning system issues a low battery charge warning. In another aspect, a battery icon or image may be permanently displayed on the display 20 and may be filled or partially filled to provide an estimate of the battery's charge. For example, half the image may be filled and then immediately changed to a non-filled image if the battery warning system determines that a low battery charge warning should be issued. The displayed notice may be accompanied by an audible notice such as a beep, vibration, etc.

Alternatively, or in addition to a warning such as those described above, a notice of a potential low battery charge situation may be provided as a charging agenda. The charging agenda may be presented as a list of various opportunities when and/or where the user may be able to and may wish to recharge the device. The list may be generated using the method described above with respect to the battery warning system including the charge state of the battery, the predicted usage and predicted power requirements of the device, and a known future usage and/or location of the device as determined from one or more stored calendar event records. For example, the battery warning system may generate a charging agenda with the following entries/suggestions to the user: "Charge at home around 7 AM," "Charge in the office at 1 PM before the teleconference meeting," "Charge in Bob's home when you meet him for dinner tonight;" and the like. The device may be programmed (pre-programmed or configured by the user) to generate a charging agenda at a particular time of day, or at a programmed time interval (e.g., every 2 hours, 4 hours, etc.). Alternatively, a user may make a request that the device generate a charging agenda.

As will be appreciated by one of skill in the art, computer program elements and/or circuitry elements of the invention may be embodied in hardware and/or in software (including firmware, resident software, micro-code, etc.). The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

The system and method of determining whether a low batter charge warning should be issued may be further understood by the following illustrative examples. The following examples are merely for illustrating various aspects that may be associated with the methods and systems and are not intended to limit the same.

Example 1

Referring to the process of FIG. 5 and the usage profile of FIG. 3, at time $t_1$ (hour 6 in FIG. 3), the batter power application 90 obtains data/information from the battery power application that the charge remaining on the battery is about 20%. The battery warning system obtains the usage profile shown in FIG. 3 and determines the predicted usage from the usage profile for an upcoming time period such as from hours 6-10. The battery warning system determines the predicted power requirement for the predicted usage between hours 6-10 to be at least about 40% of the battery's power. The battery warning system determines that the remaining battery power (20%) is not sufficient to satisfy the upcoming predicted power requirement and issues a command to the device to generate and display a warning to charge the battery. Thus, the battery warning system provides an advance warning that the battery should be charged.

Comparatively, in a device with a conventional battery warning system where the warning is based solely on the charge of the battery, the charge battery warning may not be given until there is only 5-10% charge remaining. Thus, at time $t_1$ a warning would not be generated in a conventional device having a remaining charge of 20% at $t_1$. In a device with a conventional warning system, the low battery warning may not be provided until, for example, some time in hour 10. At that time, however, the warning may come too late for the user to recharge the device.

Example 2

At time $t_2$ (hour 11 in FIG. 3), the battery power application 72 determines that the charge remaining on the battery is about 20%, and the battery warning system 90 obtains this data. The battery warning system determines the predicted usage of the device for a time period, e.g., between hours 11-16, and determines the predicted power requirement for this usage. In this example, the usage profile in FIG. 3 shows that the predicted usage of the device will decrease or be low during hours 11-16. For example, the predicted power requirement for the predicted usage may be about 10%. Since this is sufficient to power the device for the predicted usage, no low battery warning is given.

Example 3

At time $t_5$ (hour 18 in FIG. 3), the battery power application 72 determines that the charge remaining on the battery is about 20%, and the battery warning system obtains this information from the battery power application. The battery warning system 90 determines that the predicted power requirement for the predicted usage between, for example, hours 18-22 is about 25%. Since this predicted power requirement is greater than the remaining charge of the battery, the battery warning system 90 issues a command for the device to generate a warning.

As another example, a user may have a high usage pattern during the weekend. The battery warning system 90 may determine the usage pattern for a two-day, weekend time period and issue a warning even though there is currently 30% or 40% of battery charge remaining.

Example 4

A calendar application may have a stored event record blocking out two hours of the day such as, for example between hours $t_3$ and $t_4$ in FIG. 3. The event record may have data associated with it to indicate that the event is a meeting. Employing aspects of the method described with respect to FIG. 5, this data may be recognized by the battery warning system as a usage event, and thereby recognize that the device's telephone or call functionality will be used during the time. The battery warning system may be configured to determine the power requirement for a (relatively) constant usage of the telephone or call functionality for the given period of time; in this case, two hours. For purposes of illustration only, a two-hour, relatively constant usage of the device's telephone functionality may require 30% of the battery's power. At time $t_2$, the battery warning system obtains data from the battery power application that the battery has a remaining charge of about 20%. The battery warning system determines, similar to Example 2, that the predicted power requirement be time $t_2$ and $t_4$ is 10% (or less). The battery warning system correlates the predicted power requirement from the usage profile with the predicted usage associated with the calendar event record, and determines the upcoming power requirement will be at least 30% for the time frame from $t_2$ to $t_4$. Since this is greater than the remaining charge, the battery warning system 90 issues a command to generate a low battery charge warning. Not accounting for the calendar event record, the battery warning system may not issue a low battery warning at time $t_2$ because the projected power demand between $t_2$ and $t_4$ is less than 20.

Although the invention has been shown and described with reference to certain exemplary embodiments, it is understood that equivalents and modifications may occur to others skilled in the art upon reading and understanding the specification. The present invention is intended to include all such equivalents and modifications as they come within the scope of the following claims.

The invention claimed is:

1. A portable electronic device comprising:
a rechargeable power source;
a calendar application that stores a record of a future event, the event record having data associated therewith indicating a future usage of the electronic device; and
a battery warning system that executes logic to generate a low battery charge warning, the logic including code to:
obtain data related to a charge state of the rechargeable power source at a time $t_n$;
determine a predicted usage of the device for a period of time relative to time $t_n$;
determine a predicted power requirement to power the device during the predicted usage;
determine a power requirement of the device associated with the event record, and correlate the power requirement associated with the event record with the power requirement determined from the predicted usage of the device relative to time $t_n$;
determine if the charge state of the power source is sufficient to supply the power, down to a threshold level, for the predicted power requirement; and
generate a notice if the charge state is not sufficient for the predicted power requirement.

2. The portable electronic device of claim 1, wherein the notice comprises a charging agenda for the user.

3. The portable electronic device of claim 1, wherein a predicted usage is determined from a usage profile of the device.

4. The portable electronic device of claim 3, wherein the usage profile relates to an average usage of the device for a selected 24-hour period.

5. The portable electronic device of claim 1, wherein the threshold level is a charge state of about 0%.

6. The portable electronic device of claim 1, wherein the threshold level is configurable by a user.

7. The portable electronic device of claim 1, comprising a calendar application that stores a record of a future event, the event record having data associated therewith indicating a location of the device during the event, wherein the logic executed by the battery warning system includes code to determine a predicted power requirement of the device based on the predicted usage of the device from time $t_n$ through the time associated with the event record and determine if the charge state of the battery is sufficient to provide the power required for the electronic device through the event.

8. The portable electronic device of claim 7, wherein the location data associated with an event includes data indicating if the device will have access to a charging source.

9. The portable electronic device of claim 1, comprising a position location application configured to determine a geographic location of the electronic device.

10. The portable electronic device of claim 9, wherein the position location application associates data with the geographic location of the device indicating the availability of a charging source for the electronic device.

11. The portable electronic device according to claim 10, wherein the logic of the battery warning system includes code to correlate the predicted power requirement determined from the usage profile with data associated with the determined geographic location.

12. The portable electronic device of claim 1, wherein the portable electronic device is a mobile phone.

13. A method of generating a notice of a low battery charge for an electronic device having a rechargeable battery, the method comprising:
- obtaining data associated with an event record stored in a calendar application on the device, the data indicating whether the event is associated with a usage of the device;
- determining a charge state of the battery at a time $t_n$;
- determining a predicted usage of the device for a period of time relative to time $t_n$;
- determining a predicted power requirement for the predicted usage, wherein determining the predicted usage of the device comprises correlating the predicted power requirement for the predicted usage with the future usage associated with the event record;
- determining if the charge state of the battery at time $t_n$ is sufficient to supply the power, down to a threshold level, for the predicted power requirement associated with the predicted usage; and
- issuing a command to generate a notice if the charge state is not sufficient for the predicted power requirement.

14. The method of claim 13, comprising (i) obtaining data associated with an event record stored in a calendar application on the device, the data associated with the event record including data indicating a location of the device during the event, the location data indicating whether the device will be accessible to a charging source for recharging the battery, (ii) determining a predicted power requirement from time $t_n$ through the time associated with event record, and (iii) determining if the remaining charge is sufficient to satisfy the predicted power requirement through the event.

15. The method according to claim 13, wherein the notice comprises a charging agenda for the user.

16. The method of claim 13 comprising determining the predicted usage of the device from a usage profile.

17. The method of claim 16, wherein the usage profile comprises the usage profile of the device for a 24-hour period.

* * * * *